(12) United States Patent
Hopper et al.

(10) Patent No.: US 8,377,792 B2
(45) Date of Patent: Feb. 19, 2013

(54) METHOD OF FORMING HIGH CAPACITANCE SEMICONDUCTOR CAPACITORS WITH A SINGLE LITHOGRAPHY STEP

(75) Inventors: Peter J. Hopper, San Jose, CA (US); William French, San Jose, CA (US); Peter Smeys, San Jose, CA (US); Peter Johnson, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 457 days.

(21) Appl. No.: 12/756,097

(22) Filed: Apr. 7, 2010

(65) Prior Publication Data

US 2011/0250730 A1    Oct. 13, 2011

(51) Int. Cl.
*H01L 21/027*    (2006.01)
*H01L 21/266*    (2006.01)

(52) U.S. Cl. ......... 438/399; 438/396; 438/788; 205/122
(58) Field of Classification Search .................. None
See application file for complete search history.

(56) References Cited

U.S. PATENT DOCUMENTS 5,576,925 A * 11/1996 Gorowitz et al. .......... 361/301.2
6,437,385 B1    8/2002 Bertin et al.
2008/0297878 A1* 12/2008 Brown et al. ................. 359/263

* cited by examiner

*Primary Examiner* — Zandra Smith
*Assistant Examiner* — Pamela E Perkins
(74) *Attorney, Agent, or Firm* — Eugene C. Conser; Wade J. Brady, III; Frederick J. Telecky, Jr.

(57) ABSTRACT

An interdigitated semiconductor capacitor with a large number of plates and a capacitance in the micro-farad range is formed on a wafer with only a single lithography step by depositing each odd layer of metal through a first shadow mask that lies spaced apart from the wafer, and each even layer of metal through a second shadow mask that lies spaced apart from the wafer.

9 Claims, 11 Drawing Sheets

METHOD OF FORMING HIGH CAPACITANCE SEMICONDUCTOR CAPACITORS WITH A SINGLE LITHOGRAPHY STEP

BACKGROUND OF THE INVENTION

1. Field of the Invention

The present invention relates to a method of forming capacitors and, more particularly, to a method of forming high capacitance semiconductor capacitors with a single lithography step.

2. Description of the Related Art

A semiconductor capacitor is a well-known structure that typically includes two metal plates that are vertically separated by a dielectric layer. Semiconductor capacitors are commonly formed as part of the metal interconnect structure, which allows the capacitors to be formed without requiring any additional lithography steps.

For example, the lower capacitor plate can be formed at the same time that a first metal layer is etched to form a first layer of metal traces, while the upper capacitor plate can be formed at the same time that a second metal layer is etched to form a second layer of metal traces. In this case, the interlayer dielectric that electrically isolates the first layer of metal traces from the second layer of metal traces functions as the capacitor dielectric.

Although a capacitor which is formed as part of the metal interconnect structure does not require any additional lithography steps, and thus comes for free, the capacitance of the capacitor is limited by the available area and the requirements of the metal interconnect structure. In other words, the area that can be occupied by a capacitor, the vertical spacing between the first and second layers of metal traces, and the material used as the interlayer dielectric are defined by the requirements of the metal interconnect structure, not by the requirements of the capacitor.

Semiconductor capacitor structures, which include capacitors with multiple interdigitated plates and different dielectric materials, have higher capacitances than capacitors formed as part of the metal interconnect structure, but these semiconductor capacitor structures typically require a large number of lithography steps to form.

Lithography, in turn, is one of the most expensive steps in a semiconductor fabrication process. Thus, there is a need for a method of forming capacitors which have more substantially more capacitance than the capacitors formed as part of the metal interconnect structure and require fewer lithography steps than conventional high-value capacitors.

BRIEF DESCRIPTION OF THE DRAWINGS

FIG. 2A illustrates a first shadow mask 200, while FIG. 2B illustrates a second shadow mask 250.

FIG. 8A is a plan view, FIG. 8B is a cross-sectional view taken along line 8B-8B of FIG. 8A, and FIG. 8C is a cross-sectional view taken along line 8C-8C of FIG. 8A.

FIG. 9A is a plan view, FIG. 9B is a cross-sectional view taken along line 9B-9B of FIG. 9A, FIG. 9C is a cross-sectional view taken along line 9C-9C of FIG. 9A, and FIG. 9D is a cross-sectional view taken along line 9C-9C of FIG. 9A.

FIG. 10A is a plan view, FIG. 10B is a cross-sectional view taken along line 10B-10B of FIG. 10A, and FIG. 10C is a cross-sectional view taken along line 10C-10C of FIG. 10A.

FIG. 11A is a plan view, FIG. 11B is a cross-sectional view taken along line 11B-11B of FIG. 11A, and FIG. 11C is a cross-sectional view taken along line 11C-11C of FIG. 11A.

FIG. 14A illustrates a first definitional shadow mask 1400, while FIG. 14B illustrates a second definitional shadow mask 1450.

DETAILED DESCRIPTION OF THE INVENTION

The method of the present invention utilizes a multi-chamber semiconductor processing system. A multi-chamber semiconductor processing system is a system that accepts a wafer, reduces the air pressure within the system to a level that is below atmospheric pressure, and then moves the wafer from chamber to chamber in a specified sequence without breaking the vacuum. While in each chamber, the wafer is subjected to a specific processing step.

For example, a multi-chamber semiconductor processing system can be implemented with a cluster tool or a sequencer.

A cluster tool provides random access such that the specified sequence can be from any chamber to any other chamber. A sequencer, on the other hand, provides a fixed sequence of chambers.

In a first embodiment of the present invention, the multi-chamber semiconductor processing system includes three chambers: a first chamber for depositing a metal, a second chamber for depositing a dielectric, and a third chamber for depositing a metal. The first and third chambers can be implemented with, for example, a plasma vapor deposition (PVD) chamber. The second chamber can be implemented with any conventional dielectric deposition chamber, such as a chemical vapor deposition (CVD) chamber.

In accordance with the present invention, the first and third chambers of the multi-chamber semiconductor processing system are each modified to include a shadow mask that lies above and spaced apart from the to-be-processed surface of the wafer. A shadow mask is a metal plate, such as an aluminum plate, which has been processed to include a pattern that extends completely through the metal plate.

Figure 1:
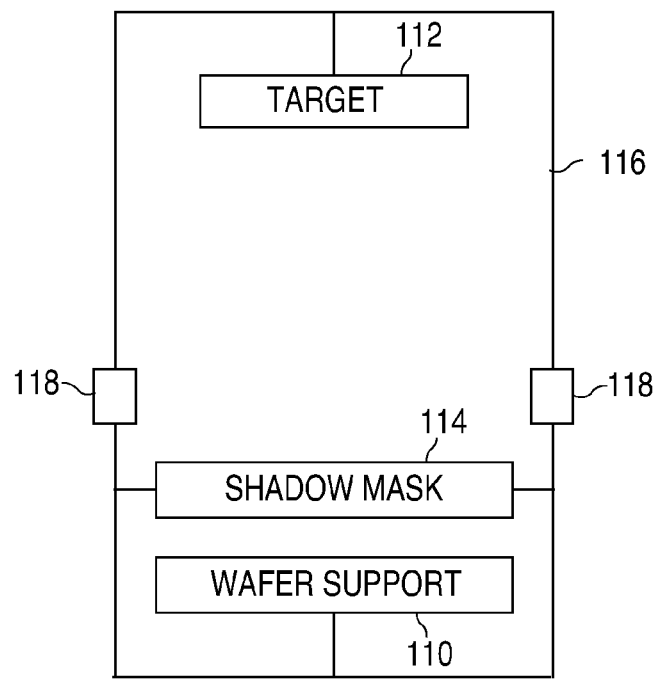
FIG. 1 is a cross-sectional view illustrating an example of a metal deposition chamber 100 in accordance with the present invention.

FIG. 1 shows a cross-sectional view that illustrates an example of a metal deposition chamber 100 in accordance with the present invention. As shown in FIG. 1, metal deposition chamber 100, which is sealed during operation, includes a wafer support 110, such as a chuck, a target 112 which lies above and spaced apart from wafer support 110, and a shadow mask 114 which lies between wafer support 110 and target 112.

In addition, metal deposition chamber 100 includes a frame structure 116 that is connected to wafer support 110, target 112, and shadow mask 114 to support wafer support 110, target 112, and shadow mask 114. Shadow mask 114 can be rigidly attached to frame structure 116 so that the distance between wafer support 110 and shadow mask 114 is fixed.

Optionally, the distance between wafer support 110 and shadow mask 114 can be varied. For example, frame structure 116 can include a vertical actuator 118 that vertically moves shadow mask 114. Alternately, wafer support 110, which can be vertically movable to engage a wafer that has been inserted into chamber 100, can be modified to include a larger vertical extension that allows the distance between wafer support 110 and shadow mask 114 to be varied.

Further, for added flexibility, metal deposition chamber 100 can include a shadow mask movement structure, such as a robotic arm, that is connected to frame structure 116 to move shadow mask 114 into position, and then remove shadow mask 114. The shadow mask movement structure allows metal deposition chamber 100 to be used with or without shadow mask 114 without the need to open chamber 100.

Figure 2A:
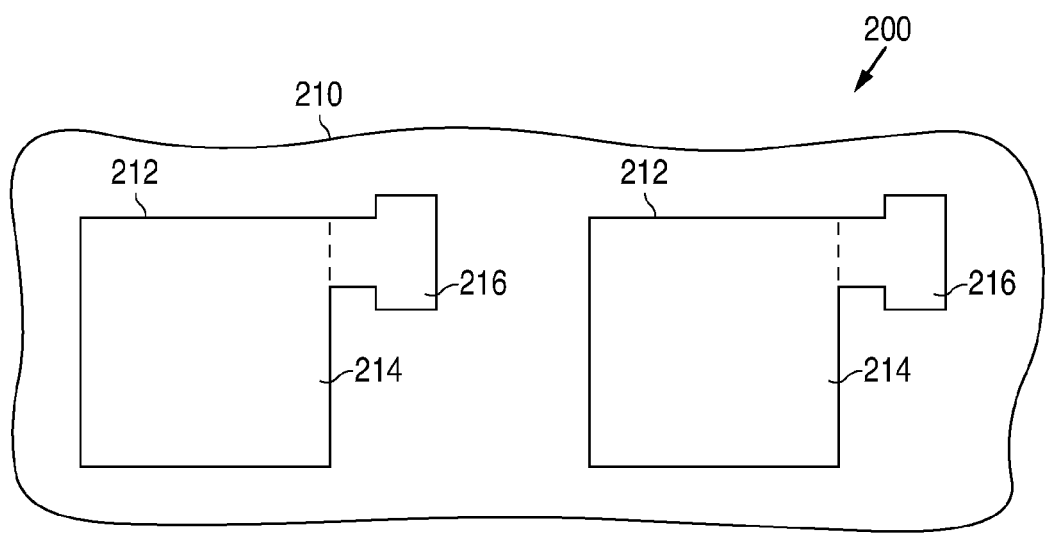
FIGS. 2A and 2B are plan views illustrating examples of shadow masks in accordance with the present invention.
Figure 2B:
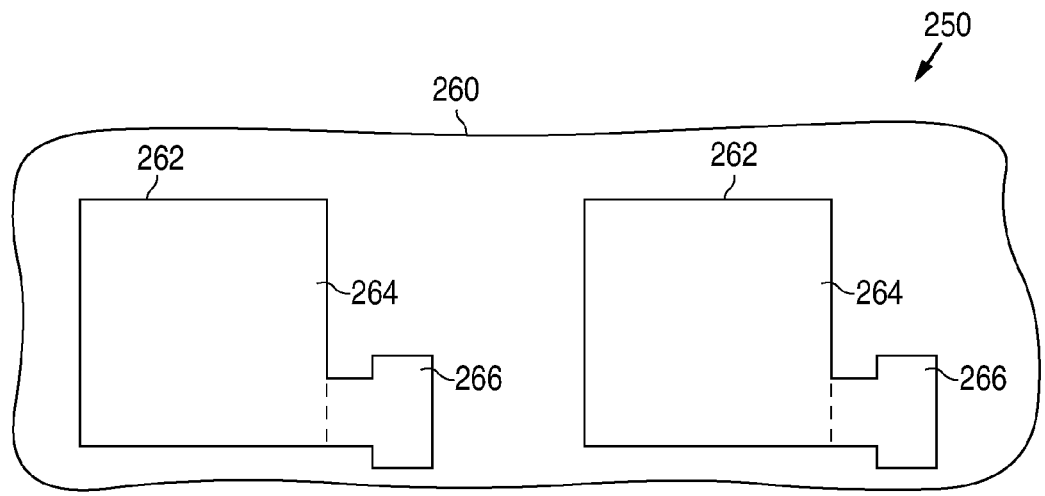

FIGS. 2A and 2B show plan views that illustrate examples of shadow masks in accordance with the present invention. FIG. 2A shows a first shadow mask 200, while FIG. 2B shows a second shadow mask 250. As shown in FIG. 2A, shadow mask 200 includes a metal plate 210, such as an aluminum plate, and an array of openings 212 that extend through metal plate 210. (Only two openings 212 are shown for purposes of clarity). Each opening 212, in turn, includes a plate region 214 and a contact region 216 that extends away from plate region 214.

Similarly, as shown in FIG. 2B, shadow mask 250 includes a metal plate 260, such as an aluminum plate, and an array of openings 262 that extend through metal plate 260. (Only two openings 262 are shown for purposes of clarity). Each opening 262, in turn, includes a plate region 264 and a contact region 266 that extends away from plate region 264.

In accordance with the present invention, the first chamber of the multi-chamber semiconductor processing system is implemented with metal deposition chamber 100 where shadow mask 114 is implemented with shadow mask 200, while the third chamber of the multi-chamber semiconductor processing system is implemented with metal deposition chamber 100 where shadow mask 114 is implemented with shadow mask 250.

Further, shadow mask 114/200 is positioned within the first chamber and shadow mask 114/250 is positioned within the third chamber so that the pattern of plate region 214 projected onto a wafer and the pattern of plate region 264 projected onto the wafer are in register (vertically aligned) within the tolerance of the semiconductor processing system.

Figure 3:
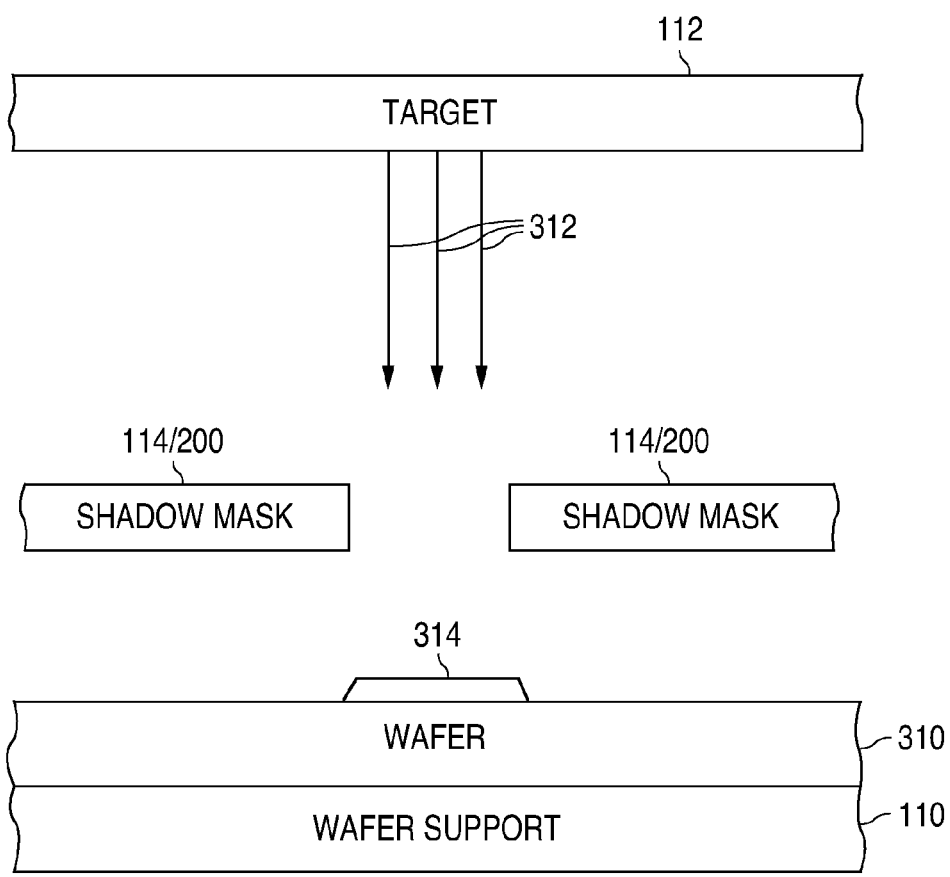
FIG. 3 is a cross-sectional view illustrating an example of the first step of a method of forming a capacitor array on a wafer in accordance with the present invention.

FIG. 3 shows a cross-sectional view that illustrates an example of the first step of a method of forming a capacitor array on a wafer in accordance with the present invention. As shown in FIG. 3, the method of the present invention begins by inserting a wafer 310 into the first chamber of the multi-chamber semiconductor processing system to lie on wafer support 110. The top surface of wafer 310 can be non-conductive.

Once inserted into the first chamber, a number of first metal atoms 312 are dislodged from target 112 in a conventional fashion. The dislodged first metal atoms 312 are electrically attracted to wafer 310, which is grounded, and pass through shadow mask 114/200 to form an array of first metal plates 314 on the top surface of wafer 310. (Only one first metal plate 314 is shown for purposes of clarity). After the formation of the array of first metal plates 314, wafer 310 is removed from the first chamber.

In a conventional PVD process, the dislodged atoms are highly anisotropic. As a result, the first metal plates 314 have a substantially uniform thickness, except for the periphery which tends to be sloped as a result of the dislodged atoms 312 which are not perfectly anisotropic. In addition, to further improve on the feature definition, shadow mask 114/200 is placed as close as possible to the top surface of wafer 310 without touching wafer 310, thereby limiting the effect of non-anisotropic atoms that pass 312 through shadow mask 114/200.

Figure 4:
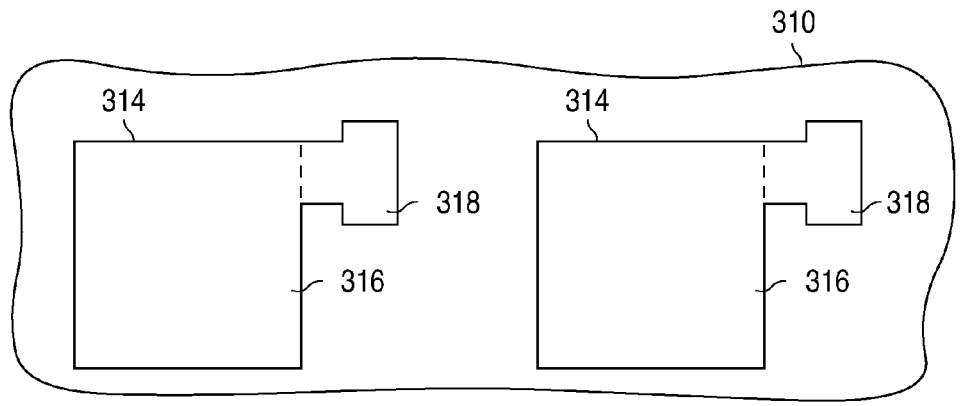
FIG. 4 is a plan view illustrating wafer 310 following the formation of the array of first metal plates 314 in accordance with the present invention.

FIG. 4 shows a plan view that illustrates wafer 310 following the formation of the array of first metal plates 314 in accordance with the present invention. (Only two metal plates 314 are shown for purposes of clarity). As shown in FIG. 4, the first metal plates 314 have the same pattern as shadow mask 114/200. As a result, each metal plate 314 has a plate region 316 and a contact region 318 that extends away from plate region 316.

Figure 5:
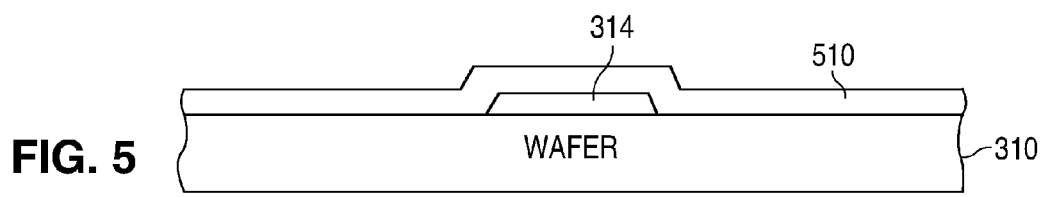
FIG. 5 is a cross-sectional view illustrating an example of the results of the second step of the method of forming the capacitor array on the wafer in accordance with the present invention.

FIG. 5 shows a cross-sectional view that illustrates an example of the results of the second step of the method of forming the capacitor array on the wafer in accordance with the present invention. After wafer 310 has been removed from the first chamber, wafer 310 is inserted into the second chamber of the multi-chamber semiconductor processing system.

Once inserted into the second chamber, a dielectric layer 510 is formed on the top surface of wafer 310 and the array of first metal plates 314 in a conventional fashion. After the formation of dielectric layer 510, wafer 310 is removed from the second chamber. As shown in FIG. 5, dielectric layer 510 is conformally formed over the array of first metal plates 314. (Only one metal plate 314 is shown for purposes of clarity).

Figure 6:
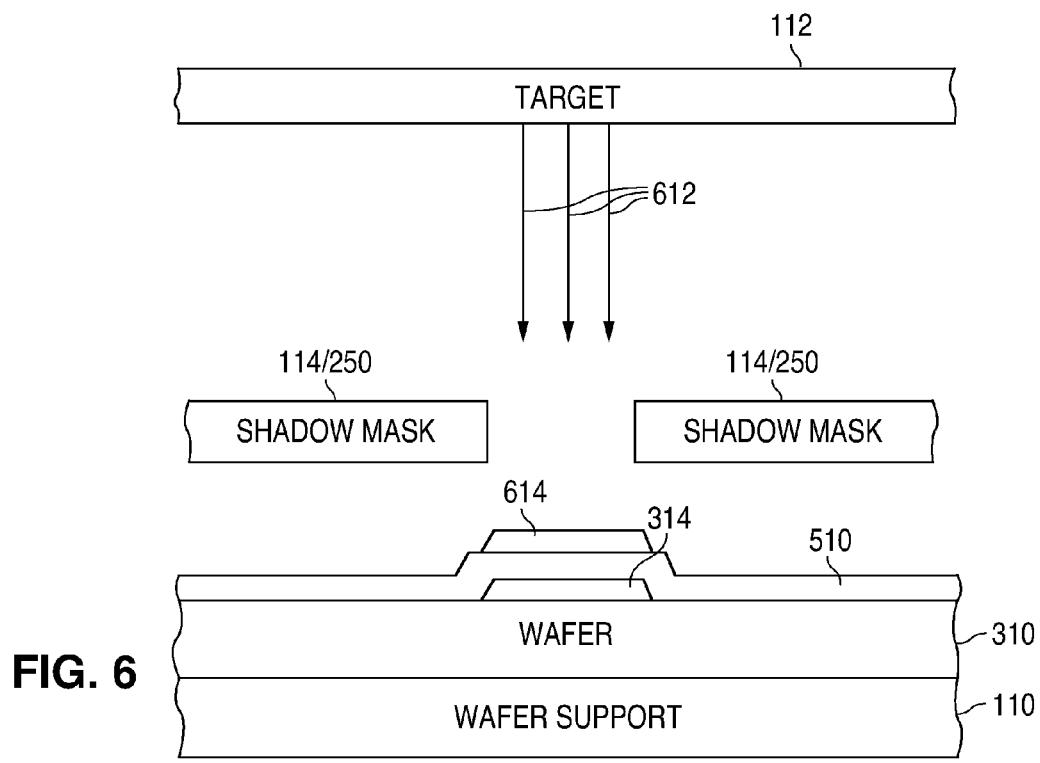
FIG. 6 is a cross-sectional view illustrating an example of the third step of the method of forming the capacitor array on the wafer in accordance with the present invention.

FIG. 6 shows a cross-sectional view that illustrates an example of the third step of the method of forming the capacitor array on the wafer in accordance with the present invention. As shown in FIG. 6, after wafer 310 has been removed from the second chamber, wafer 310 is inserted into the third chamber of the multi-chamber semiconductor processing system to lie on wafer support 110.

Once inserted into the third chamber, a number of second metal atoms 612 are dislodged from target 112 in a conventional fashion. The dislodged second metal atoms 612 are electrically attracted to wafer 310, which is grounded, and pass through shadow mask 114/250 to form an array of second metal plates 614 on the top surface of dielectric layer 510. (Only one metal plate 614 is shown for purposes of clarity). After the formation of the array of second metal plates 614, wafer 310 is removed from the third chamber.

Figure 7:
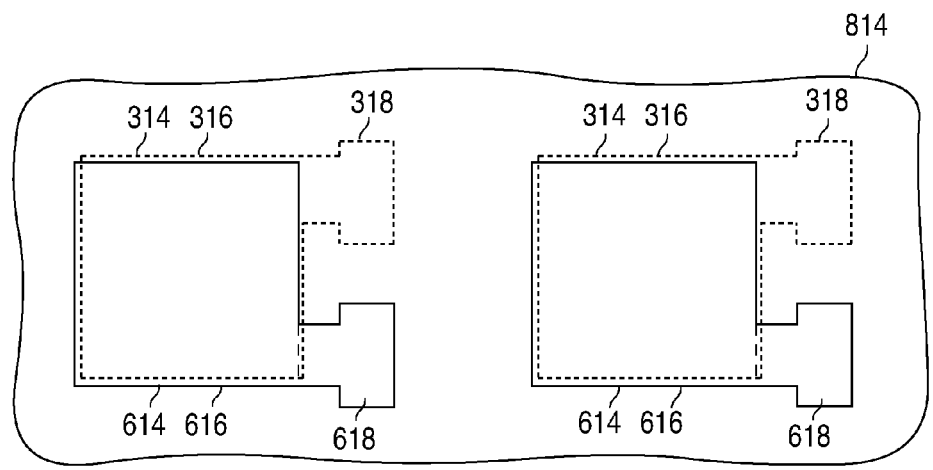
FIG. 7 is a plan view illustrating wafer 310 following the formation of the array of second metal plates 614 in accordance with the present invention.

FIG. 7 shows a plan view that illustrates wafer 310 following the formation of the array of second metal plates 614 in accordance with the present invention. (Only two metal plates 614 are shown for purposes of clarity). As shown in FIG. 7, the second metal plates 614 have the same pattern as shadow mask 114/250. As a result, each metal plate 614 has a plate region 616 and a contact region 618 that extends away from plate region 616.

FIG. 7 also illustrates that the plate region 616 of a second metal plate 614 lies over the plate region 316 of a first metal plate 314. FIG. 7 further illustrates the case where the plate region 616 of the second metal plate 614 is slightly out of register with the plate region 316 of the first metal plate 314 due to alignment tolerances within the multi-chamber semiconductor processing system. In addition, no portion of contact region 618 of the second metal plate 614 lies over contact region 318 of the first metal plate 314.

Figure 8A:
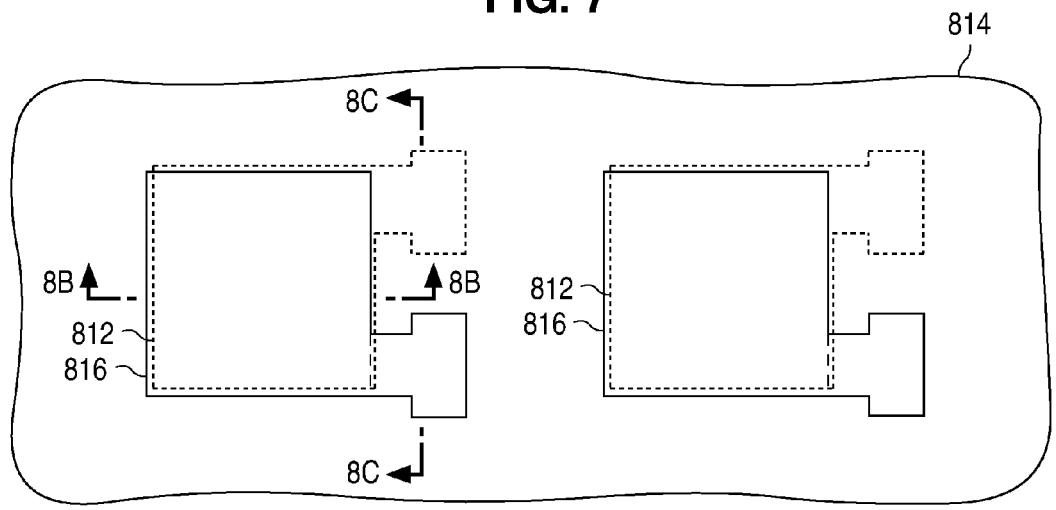
FIGS. 8A-8C are views illustrating a second round of n additional rounds of the method of forming the capacitor array on the wafer in accordance with the present invention.
Figure 8B:
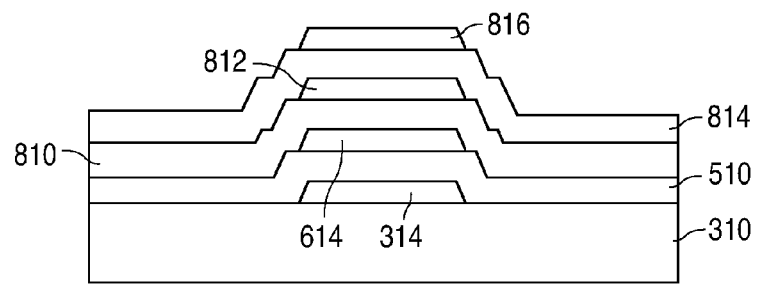
Figure 8C:
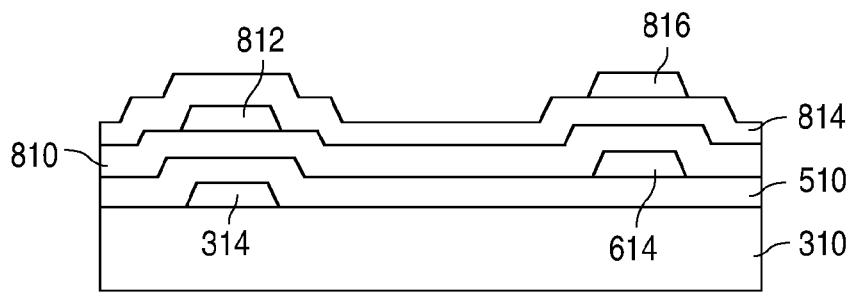

The deposition of metal plates can be terminated following the removal of wafer 310 from the third chamber or, alternately, the deposition of metal plates can continue for n additional rounds. FIGS. 8A-8C show views that illustrate a second round of n additional rounds of the method of forming the capacitor array on the wafer in accordance with the present invention. FIG. 8A shows a plan view, FIG. 8B shows a cross-sectional view taken along line 8B-8B of FIG. 8A, and FIG. 8C shows a cross-sectional view taken along line 8C-8C of FIG. 8A.

As shown in FIGS. 8A-8C, a second round of n additional rounds can be performed by moving wafer 310 from the third chamber to the second chamber where a dielectric layer 810 is formed on dielectric layer 510 and the second metal plates 614. Following this, wafer 310 is moved from the second chamber to the first chamber where a number of first metal atoms 312 are again dislodged from target 112 in a conventional fashion. The dislodged first metal atoms 312 are electrically attracted to wafer 310, which is grounded, and pass through shadow mask 114/200 to form an array of third metal plates 314 on dielectric layer 810.

After this, wafer 310 is moved from the first chamber to the second chamber where a dielectric layer 814 is formed on dielectric layer 810 and the third metal plates 812. To complete the second round, wafer 310 is moved from the second chamber to the third chamber where a number of second metal atoms 612 are again dislodged from target 112 in a conventional fashion. The dislodged second metal atoms 612 are electrically attracted to wafer 310, which is grounded, and pass through shadow mask 114/250 to form an array of fourth metal plates 816 on dielectric layer 814.

The third metal plates 812 and the fourth metal plates 816 each have plate regions and contact regions identical to the plate regions and the contact regions of the first metal plates 314 and the second metal plates 614, respectively. Further, the plate regions of the fourth metal plates 816 lie over the plate regions of the third metal plates 812, the plate regions 618 of the second metal plates 614, and the plate regions 318 of the first metal plates 314.

In addition, the contact regions of the third metal plates 812 lie over the contact regions 318 of the first metal plates 314, while the contact regions of the fourth metal plates 816 lie over the contact regions 618 of the second metal plates 614. Further, no portion of the contact regions of the third metal plates 812 lies over the contact regions 618 of the second metal plates 614, and no portion of the contact regions of the fourth metal plates 816 lies over the contact regions of the third metal plates 812 and the first metal plates 614 and 314.

The number of n additional rounds to be performed is statistically determined by the defect rate and the allowable failure rate. For example, if one out of every thousand rounds has a defect that causes a capacitor to fail, and the allowable failure rate is one out of every fifty capacitors, then each capacitor can include 20 rounds.

One of the principal causes of failure is the formation of pin holes in the dielectric layers that separate the adjacent metal plates. As a result, each of the dielectric layers, including dielectric layers 510, 810 and 814, can be formed from multiple layers of material. Further, the multiple layers of material can include two or more different types of material. Multiple layers of dielectric material substantially reduce the likelihood that a pin hole in a dielectric layer can cause a capacitor to fail.

The dielectric layers can be implemented with any conventional dielectric material, such as oxide, oxynitride, or nitride. Further, other materials, which require sintering, such as barium strontium titanate (BST), titanium oxide (TiOx), and barium titanate (BT) can also be used to implement the dielectric layers. These other materials determine the type of metal or alloy that can be used due to the sintering requirement.

The material used to form the targets 112 in the first and third chambers can be identical or different, and any metal or alloy which can be deposited by a conventional PVD process. Aluminum and chrome, which have a low sheet resistance, are two examples of materials that can be deposited to form the metal plates in the first and third chambers.

Figure 9A:
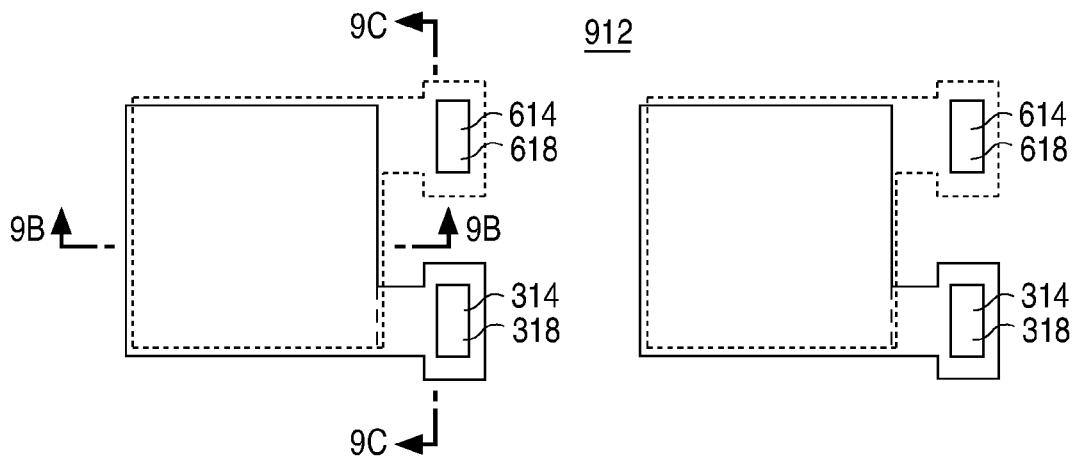
FIGS. 9A-9D are views illustrating an example of the next step following completion of the n additional rounds of the method of forming the capacitor array in accordance with the present invention.
Figure 9B:
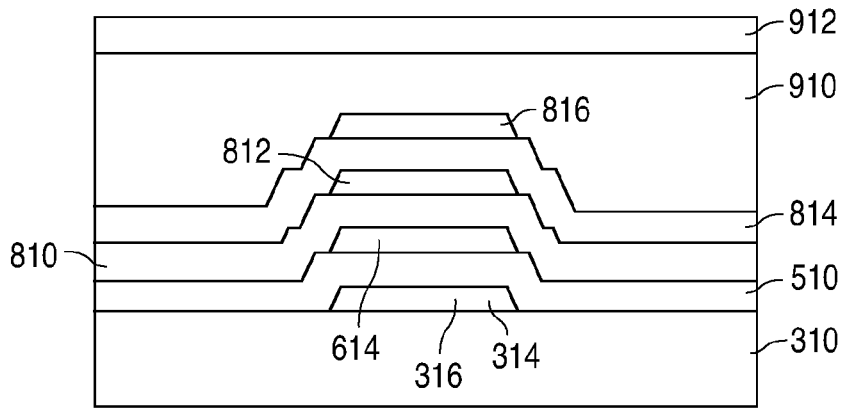
Figure 9C:
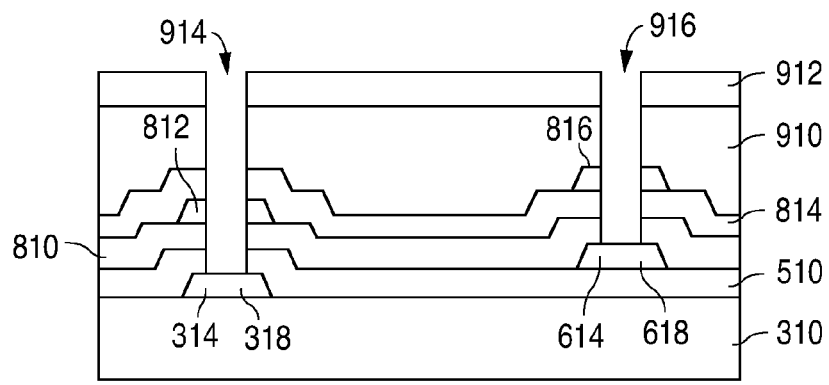
Figure 9D:
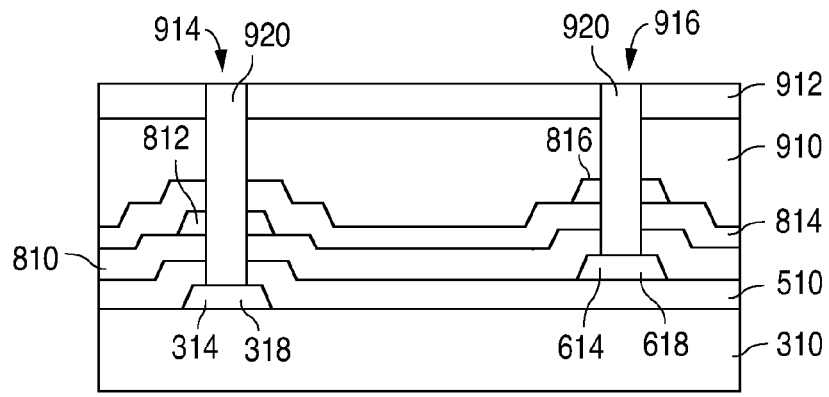

FIGS. 9A-9D show views that illustrate an example of the next step following completion of the n additional rounds of the method of forming the capacitor array in accordance with the present invention. FIG. 9A shows a plan view, FIG. 9B shows a cross-sectional view taken along line 9B-9B of FIG. 9A, FIG. 9C shows a cross-sectional view taken along line 9C-9C of FIG. 9A, and FIG. 9D shows a cross-sectional view taken along line 9C-9C of FIG. 9A. For simplicity, FIGS. 9A-9C proceed as though only two rounds of metal plates have been formed, although many additional rounds can be performed.

As shown in FIGS. 9A-9C, after the last metal plates 816 have been formed, the wafer can be removed from the multi-chamber semiconductor processing system, and a non-conducting layer 910, such as an epoxy like SU-8, can be formed on the last dielectric layer 814 and the last metal plates 816, and then planarized. Epoxies like SU-8 are substantially self planarizing and thus require little or no additional planarization.

Following this, a mask 912 is formed and patterned on non-conducting layer 910. Once patterned, the regions exposed by mask 912 are etched to form openings 914 that expose the contact regions 318 of the first metal plates 314 in the capacitor array, and openings 916 that expose the contact regions 618 of the second metal plates 614 in the capacitor array. A wet etch, a plasma etch, a physical etch, such as sandblasting, or any combination of etches can be used to form the openings 914 and 916. After the etch, mask 912 is removed.

Following this, as shown in FIG. 9D, metal contacts 920 can be formed in the openings 914 and 916 in a conventional manner (e.g., depositing a layer of metal to fill up the openings 914 and 916, and then removing the layer of metal from the top surface of non-conductive layer 910). A metal contact 920 in opening 914 touches the first and third metal plates 314 and 812 (and any additional odd numbered plate) to form the lower plate of a capacitor. A metal contact 920 in opening 916 touches the second and fourth metal plates 614 and 816 (and any additional even numbered plate) to form the upper plate of a capacitor.

Thus, a method has been described for forming an interdigitated capacitor with only a single lithography step: namely the step required to form the openings 914 and 916. Because the method of the present invention allows a large number of plates, e.g., 20 odd and 20 even plates, to be formed, the capacitor of the present invention can have very large capacitance values, e.g., in the micro-farad range.

Figure 10A:
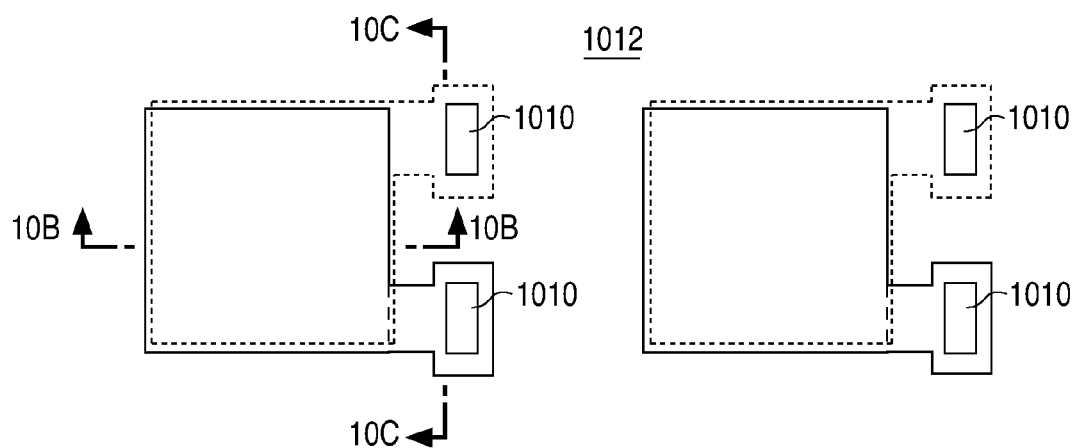
FIGS. 10A-10C are views illustrating an example of forming copper metal contacts following the formation of the openings in FIGS. 9A-9C of the method of forming the capacitor array on the wafer in accordance with the present invention.
Figure 10B:
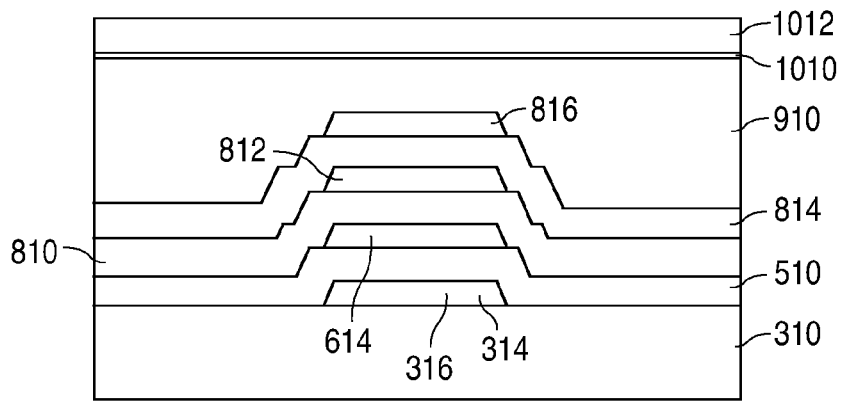
Figure 10C:
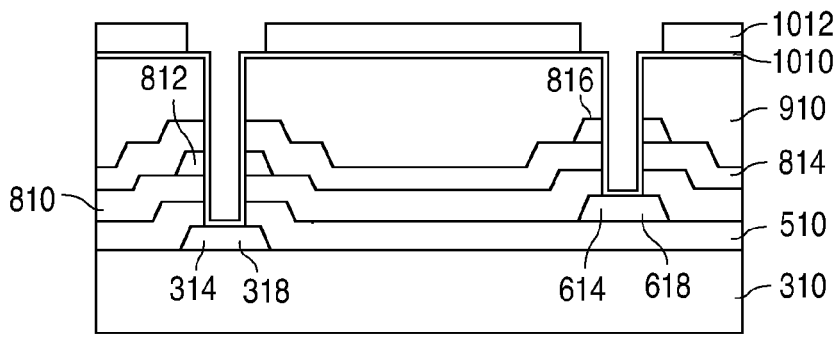

In further accordance of the present invention, the metal contacts can be formed from copper at the cost of an additional lithography step. FIGS. 10A-10C show views that illustrate an example of forming copper metal contacts following the formation of the openings in FIGS. 9A-9C of the method of forming the capacitor array on the wafer in accordance with the present invention. FIG. 10A shows a plan view, FIG. 10B shows a cross-sectional view taken along line 10B-10B of FIG. 10A, and FIG. 10C shows a cross-sectional view taken along line 10C-10C of FIG. 10A.

As shown in FIGS. 10A-10C, after mask 912 has been removed, a seed layer 1010 can be formed to touch the non-conductive layer 910, the exposed regions of the first and third metal plates 314 and 812, and the exposed regions of the second and fourth metal plates 614 and 816. For example, seed layer 1010 can be formed by depositing 300 Å of titanium, 3000 Å of copper, and 300 Å of titanium. (The seed layer can also include a barrier layer to prevent copper electromigration if needed). Once seed layer 1010 has been formed, a plating mold 1012 is formed and patterned (the second lithography step) on the top surface of the seed layer 1010.

Figure 11A:
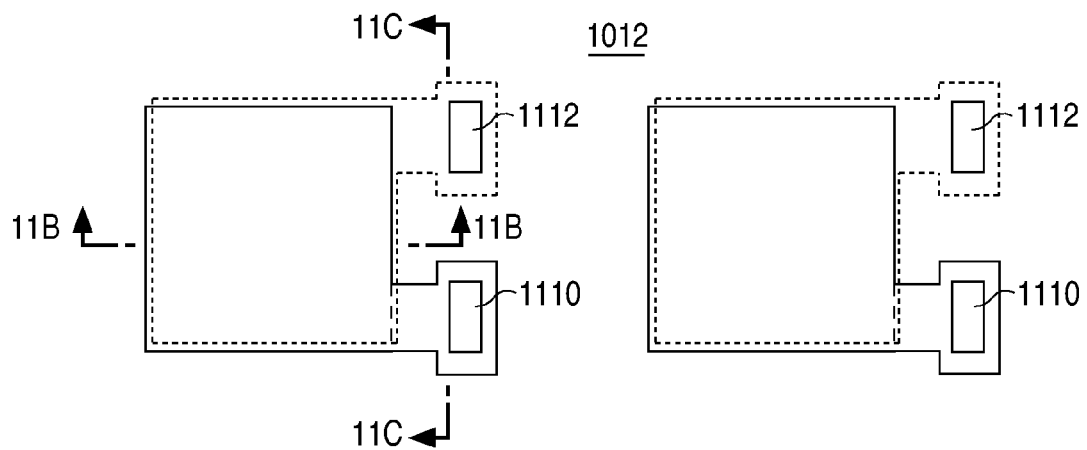
FIGS. 11A-11C are views illustrating an example of the next step following the formation of plating mold 1012 of the method of forming the capacitor array on the wafer in accordance with the present invention.
Figure 11B:
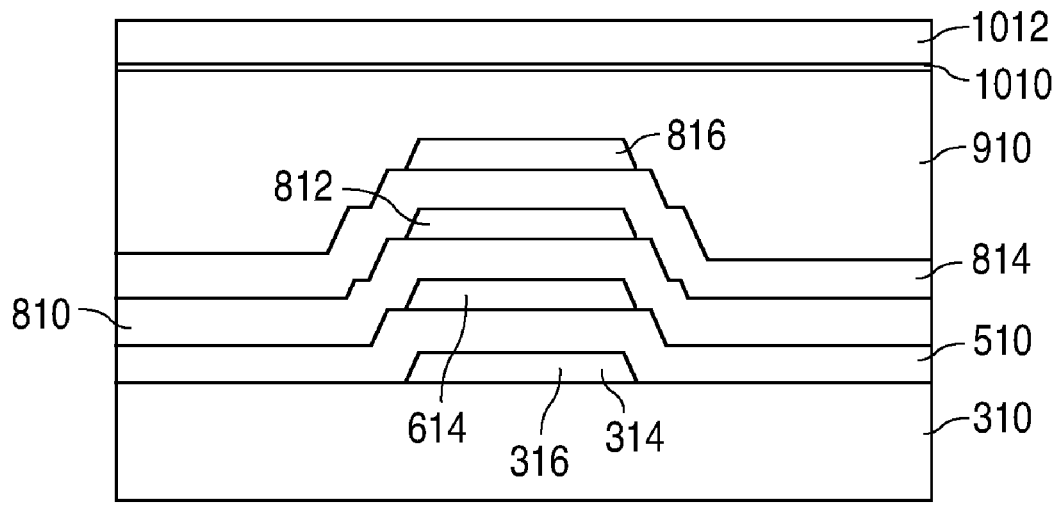
Figure 11C:
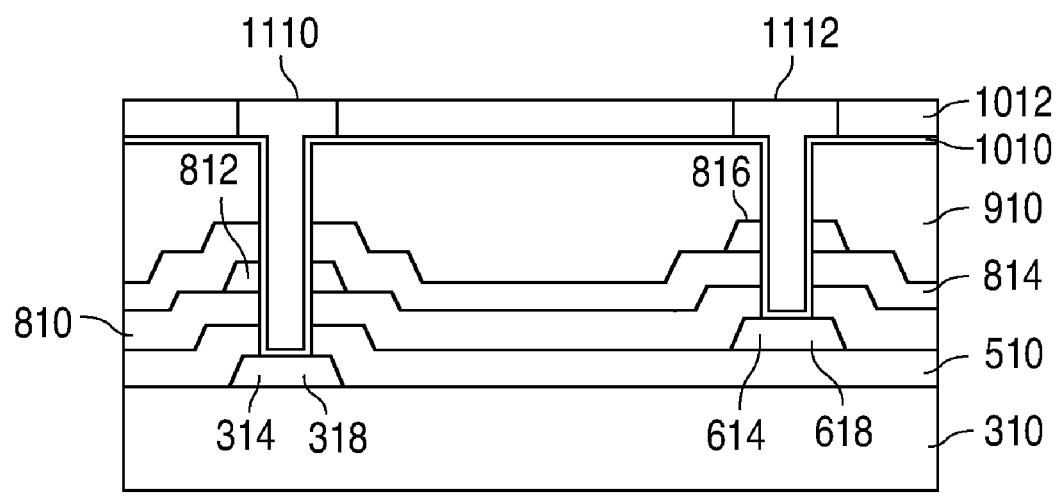

FIGS. 11A-11C show views that illustrate an example of the next step following the formation of plating mold 1012 of the method of forming the capacitor array on the wafer in accordance with the present invention. FIG. 11A shows a plan view, FIG. 11B shows a cross-sectional view taken along line 11B-11B of FIG. 11A, and FIG. 11C shows a cross-sectional view taken along line 11C-11C of FIG. 11A.

As shown in FIGS. 11A-11C, following the formation of plating mold 1012, the top titanium layer is stripped and copper is deposited by electroplating to form a number of contacts 1110 and a number of contacts 1112. (Only one contact 1110 and one contact 1112 are shown in FIG. 11C for purposes of clarity). A contact 1110 touches the first and third metal plates 314 and 812 (and any additional odd numbered plate) to form the lower plate of a capacitor, and a contact 1112 touches the second and fourth metal plates 614 and 816 (and any additional even numbered plate) to form the upper plate of a capacitor.

Figure 12:
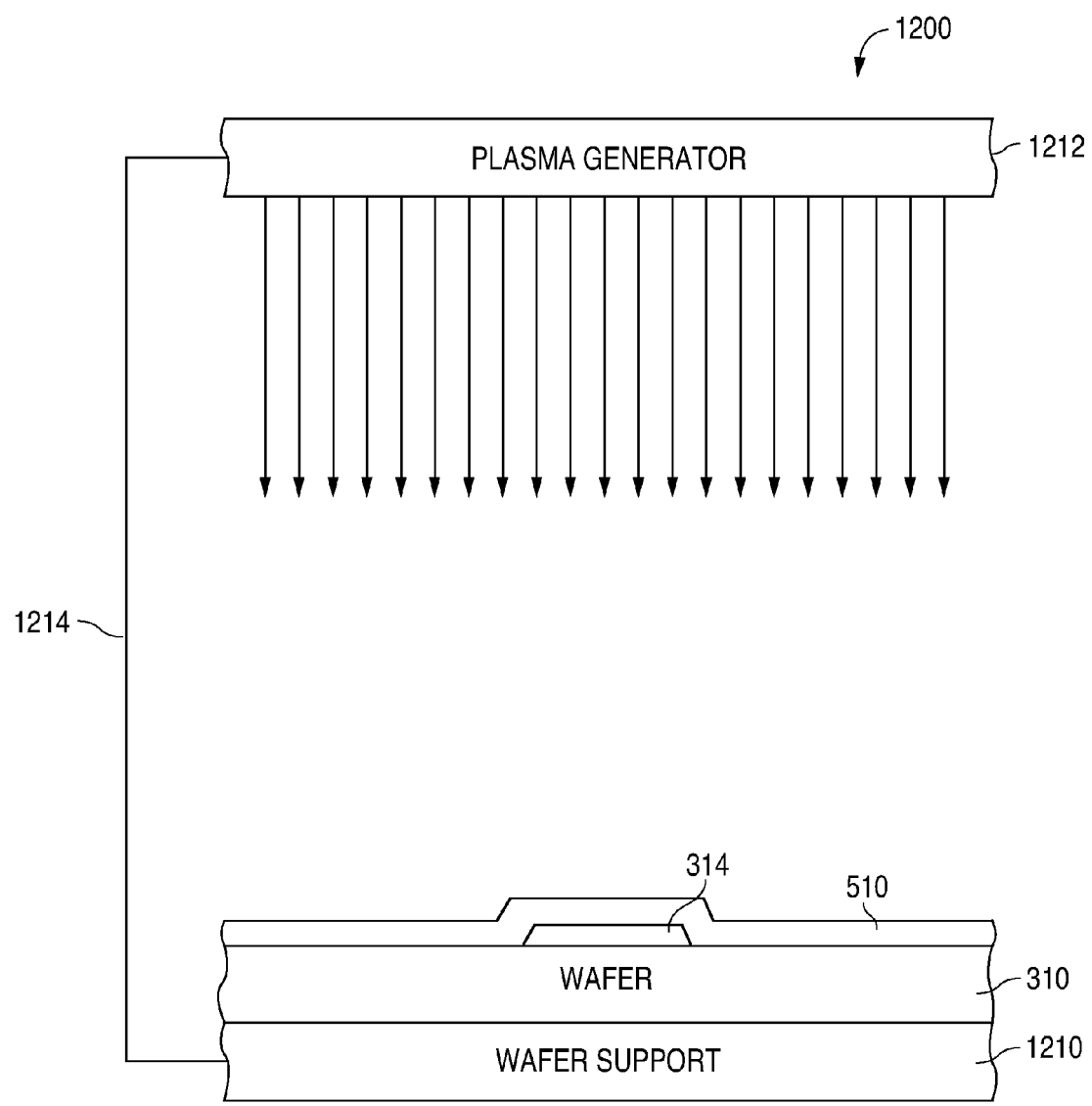
FIG. 12 is a cross-sectional view illustrating an example of a plasma etching chamber 1200 in accordance with a second embodiment of the present invention.

FIG. 12 shows a cross-sectional view that illustrates an example of a plasma etching chamber 1200 in accordance with a second embodiment of the present invention. As shown in FIG. 12, plasma etching chamber 1200, which is sealed during operation, includes a wafer support 1210, such as a chuck, and an RF plasma generator 1212 which lies above and spaced apart from wafer support 1210. In addition, plasma etching chamber 1200 also includes a frame structure 1214 that is connected to wafer support 1210 and RF plasma generator 1212 to support wafer support 1210 and RF plasma generator 1212.

In accordance with the second embodiment of the present invention, the multi-chamber semiconductor processing system can include a blanket plasma etching chamber that is implemented with plasma etching chamber 1200. In the second embodiment of the present invention, following the deposition of each dielectric layer and before the next metal plates are formed, a blanket plasma etch can be performed to remove the surface layer of the dielectric layer to remove any contaminants that may be present on the top surface of the dielectric layer. FIG. 12 illustrates a blanket plasma etch of dielectric layer 510.

Figure 13:
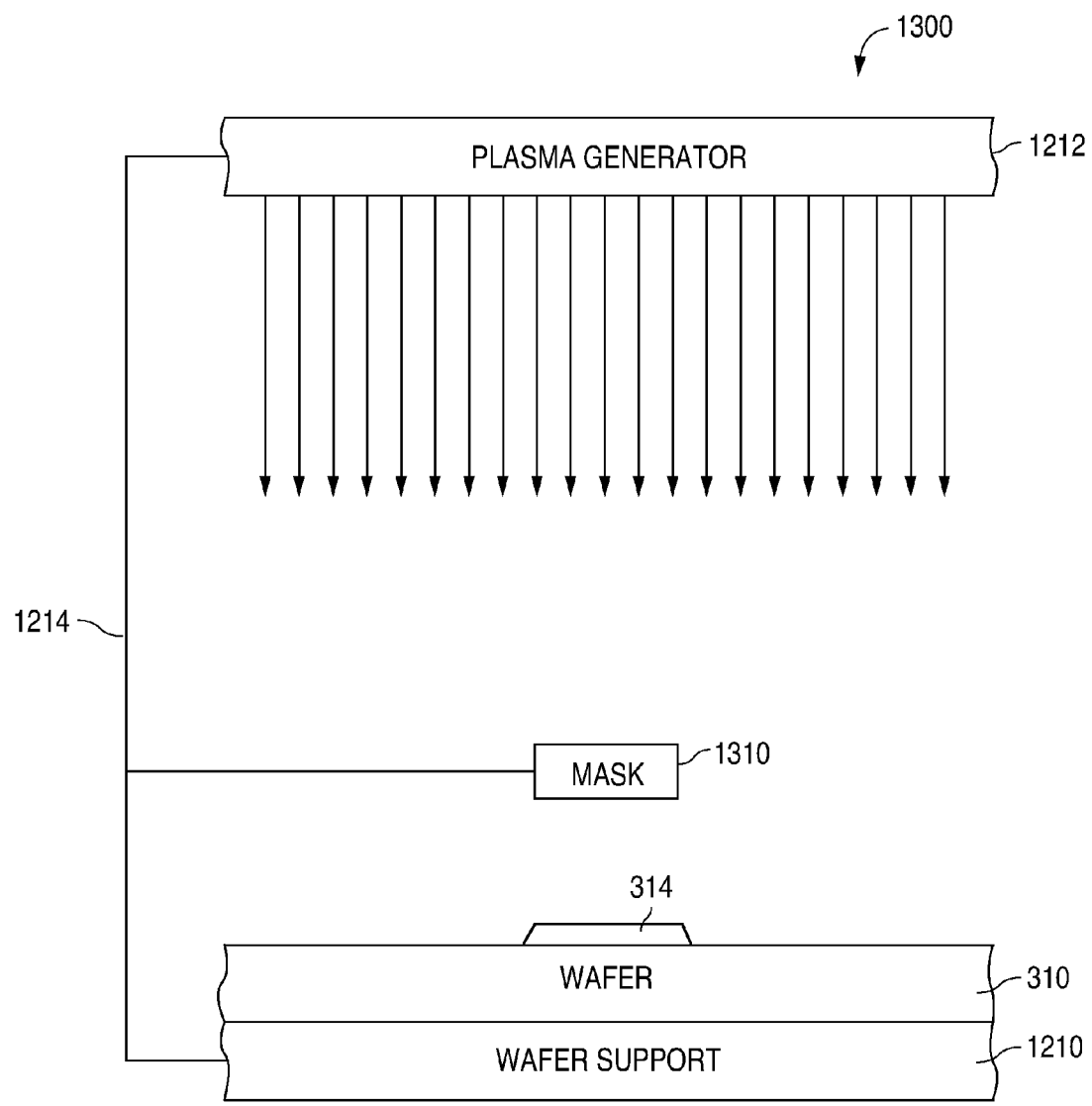
FIG. 13 is a cross-sectional view illustrating an example of a plasma etching chamber 1300 in accordance with a third embodiment of the present invention.

FIG. 13 shows a cross-sectional view that illustrates an example of a plasma etching chamber 1300 in accordance with a third embodiment of the present invention. As shown in FIG. 13, plasma etching chamber 1300 is similar to plasma etching chamber 1200 and, as a result, utilizes the same reference numerals to designate the structures which are common to both chambers.

As shown in FIG. 13, plasma etching chamber 1300 differs from plasma etching chamber 1200 in that plasma etching chamber 1300 includes a definitional shadow mask 1310 that is connected to frame structure 1214 to lie between wafer support 1210 and RF plasma generator 1212.

Figure 14A:
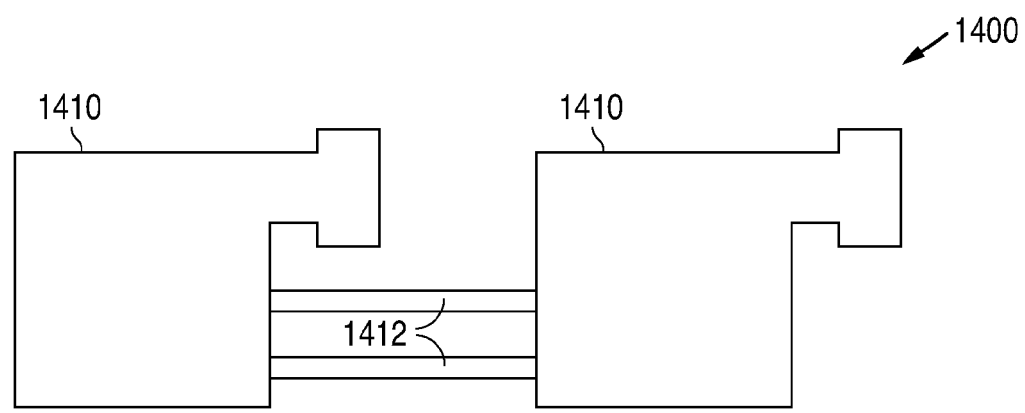
FIGS. 14A and 14B are plan views illustrating examples of definitional shadow masks in accordance with the present invention.
Figure 14B:
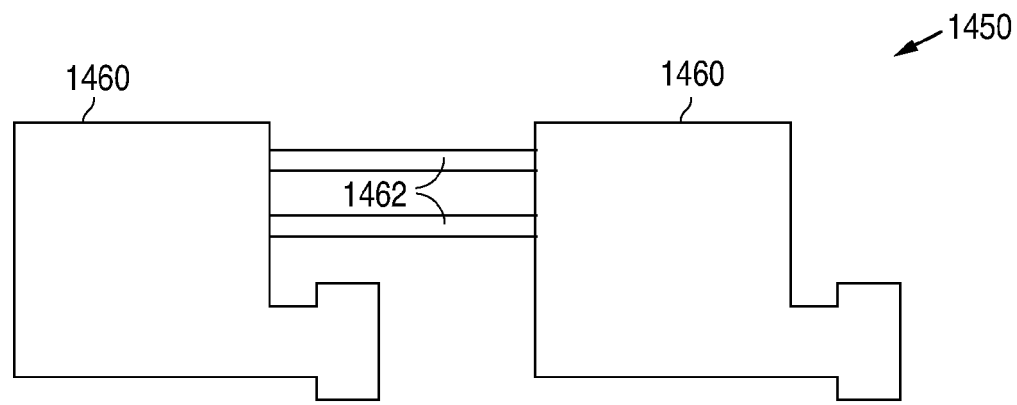

FIGS. 14A and 14B show plan views that illustrate examples of definitional shadow masks in accordance with the present invention. FIG. 14A shows a first definitional shadow mask 1400, while FIG. 14B shows a second definitional shadow mask 1450. As shown in FIG. 14A, definitional shadow mask 1400, which can be implemented with aluminum, includes a number of metal plate regions 1410 which are generally the inverse of the openings in shadow mask 200, and a number of support regions 1412 which connect the metal plate regions 1410 together. (Only two metal plate regions 1410 are shown for purposes of clarity).

Similarly, as shown in FIG. 14B, definitional shadow mask 1450, which can be implemented with aluminum, includes a number of metal plate regions 1460 which are generally the inverse of the openings in shadow mask 250, and a number of support regions 1462 which connect the metal plate regions 1460 together. (Only two metal plate regions 1460 are shown for purposes of clarity).

In accordance with the third embodiment of the present invention, the multi-chamber semiconductor processing system can include a first definitional plasma etching chamber that is implemented with plasma etching chamber 1300 where definitional shadow mask 1310 is implemented with definitional shadow mask 1400, and a second definitional plasma etching chamber that is implemented with plasma etching chamber 1300 where definitional shadow mask 1310 is implemented with definitional shadow mask 1450.

In the third embodiment of the present invention, following the deposition of each of the odd numbered metal plates, e.g., the first metal plates 314 and the third metal plates 812, and before the next dielectric layer is formed, wafer 310 is plasma etched through definitional shadow mask 1310/1400 to remove any layer of metal that may extend from one metal plate to an adjacent metal plate.

For example, when the pitch between adjacent first metal plates 314 is very small, a thin layer of metal may extend between the two first metal plates 314 due to the non-anisotropic atoms that passed through shadow mask 200. The definitional plasma etch removes this thin layer of metal to insure that each metal plate is separated from each other laterally adjacent metal plate. FIG. 13 illustrates a definitional shadow masked plasma etch of the first metal plates 314. (Only one metal plate 314 is shown for purposes of clarity).

Similarly, following the deposition of each of the even numbered metal plates, e.g., the second metal plates 614 and the fourth metal plates 816, and before the next dielectric layer is formed, wafer 310 is plasma etched through definitional shadow mask 1310/1450 to remove any layer of metal that may extend from one metal plate to an adjacent metal plate.

Figure 15:
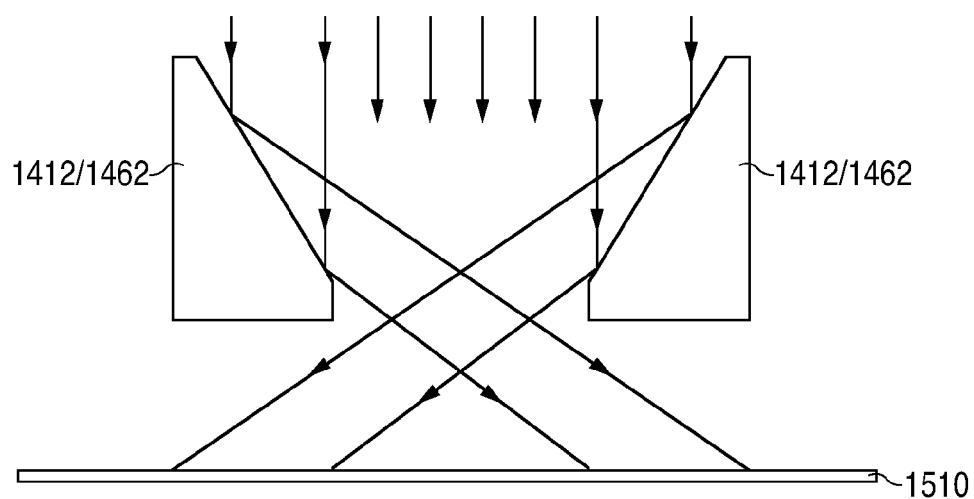
FIG. 15 is a cross-sectional view illustrating an example of the support regions 1412 and 1462 of the definitional shadow masks 1400 and 1450 in accordance with the present invention.

FIG. 15 shows a cross-sectional view that illustrates an example of the support regions 1412 and 1462 of the definitional shadow masks 1400 and 1450 in accordance with the present invention. As shown in FIG. 15, when a thin layer of metal 1510 extends from one metal plate to an adjacent metal plate, the support regions 1412 or the support regions 1462 (depending on whether an odd or an even metal layer is being etched) block the plasma etch from removing the thin layer of metal 1510 that lies directly below the support regions 1412 and 1462.

However, as further shown in FIG. 15, the side walls of the support regions 1412 and 1462 are angled so that the plasma etching particles blocked by each support region 1412 and 1462 are reflected to remove the thin layer of first metal 1510 that lies directly below the adjacent support regions 1412 and 1462.

It should be understood that the above descriptions are examples of the present invention, and that various alternatives of the invention described herein may be employed in practicing the invention. Therefore, it is intended that the following claims define the scope of the invention and that structures and methods within the scope of these claims and their equivalents be covered thereby.

What is claimed is:

1. A method of forming a capacitor comprising:

depositing a plurality of first atoms from a first target onto a wafer to form a first metal structure on the wafer, the first atoms passing through a first shadow mask, the first shadow mask being spaced apart from a top surface of the wafer;

forming a first non-conductive layer that touches and lies over the wafer and the first metal structure;

depositing a plurality of second atoms from a second target onto the first non-conductive layer to form a second metal structure on the first non-conductive layer, the second atoms passing through a second shadow mask, the second shadow mask being spaced apart from a top surface of the first nonconductive layer;

wherein each metal structure has a plate region and a contact region that extends away from the plate region;

the plate region of the second metal structure lies over the plate region of the first metal structures; and no portion of the contact region of the second metal structure lying over the contact region of the first metal structure;

forming a second non-conductive layer that touches and lies over the first non-conductive layer and the second metal structure;

depositing a plurality of third atoms from the first target onto the second non-conductive layer to form a third metal structure on the second non-conductive layer, the third atoms passing through the first shadow mask, the first shadow mask being spaced apart from a top surface of the second non-conductive layer;

forming a third non-conductive layer that touches and lies over the second non-conductive layer and the third metal structure;

depositing a plurality of fourth atoms from the second target onto the third non-conductive layer to form a fourth metal structure on the third non-conductive layer, the fourth atoms passing through the second shadow mask, the second shadow mask being spaced apart from a top surface of the third nonconductive layer;

forming a fourth non-conductive layer that touches and lies over the third non-conductive layer and the fourth metal structure;

each metal structure has a plate region and a contact region that extends away from the plate region;

the plate region of the fourth metal structure lies over the plate regions of the third, second, and first metal structures;

the contact region of the third metal structures lies over the contact region of the first metal structure;

the contact region of the fourth metal structures lies over the contact region of the second metal structure;

no portion of the contact region of the third metal structure lying over the contact region of the second metal structure;

no portion of the contact region of the fourth metal structure lying over the contact regions of the first and third metal structures;

continue depositing alternating layers of metal and non-conductive material until a predetermined value of capacitance is reached, wherein the last layer of the alternating layers of metal and non-conductive material is comprised of non-conductive material;

forming a final non-conductive layer that touches and lies over the last non-conductive layer;

simultaneously forming a first opening to expose the contact region of the first metal structure, and a second opening to expose the contact region of the second metal structure; and forming a first metal contact structure in the first opening to make an electrical connection with the contact region of the first metal structure, the contact region of the third metal structure and all subsequent odd numbered metal structures, and a second metal contact structure in the second opening to make an electrical connection with the contact region of the second metal structure, the contact region of the fourth metal structure and all subsequent even numbered metal structures.

2. The method of claim 1 and further comprising etching a top surface of the first non-conductive layer and all subsequent non-conductive layers except the last non-conductive layer before the plurality of atoms are deposited to form the metal structures over the non-conductive layers.

3. The method of claim 1 and further comprising:

passing atoms through a first definitional shadow mask to etch the odd numbered metal structures after the odd numbered metal structures have been formed and before the non-conductive layers are formed, the first definitional shadow mask being spaced apart from a top surfaces of the odd numbered metal structures; and passing atoms through a second definitional shadow mask to etch the even numbered metal structures after the even numbered metal structures have been formed and before the non-conductive layers are formed, the second definitional shadow mask being spaced apart from a top surfaces of the even numbered metal structures.

4. The method of claim 1 wherein the non-conductive layers includes a plurality of layers of material.

5. The method of claim 4 wherein two of the plurality of layers of material are different.

6. The method of claim 1 wherein the first target and the second target are identical.

7. The method of claim 1 wherein the first atoms, the third atoms and all subsequent odd number atoms are deposited in a first deposition chamber, the second atoms, the fourth atoms and all subsequent even number atoms are deposited in a second deposition chamber, and the first non-conductive layer, the second non-conductive layer, the third non-conductive layer and all subsequent non-conductive layers are formed in a third deposition chamber.

8. The method of claim 7 wherein the first chamber has an interior pressure that is less than an atmospheric pressure when the first atoms, the third atoms and all odd numbered atoms are deposited, the second chamber has the interior pressure when the second atoms, the fourth atoms and all even numbered are deposited, and the third chamber has the interior pressure when the first non-conductive layer, the second non-conductive layer, the third non-conductive layer and all subsequent non-conductive layers are formed.

9. The method of claim 8 wherein the wafer is continuously exposed to the interior pressure when the wafer is moved between the first chamber, the second chamber, and the third chamber.

* * * * *